United States Patent [19]

Nakagawa et al.

[11] Patent Number: 5,223,881
[45] Date of Patent: Jun. 29, 1993

[54] APPARATUS FOR CONTROLLING DEVELOPING SOLUTION

[75] Inventors: Toshimoto Nakagawa, Kawasakishi; Kouzo Tsukada, Yokohamashi; Shu Ogawa, Nagareyamashi; Shinichiro Shiotsu, Tatsunoshi, all of Japan

[73] Assignees: Hirama Rika Kenkyujio Ltd.; Nagase & Co., Ltd., both of Japan

[21] Appl. No.: 907,665

[22] Filed: Jul. 2, 1992

[30] Foreign Application Priority Data

Aug. 7, 1991 [JP] Japan .................................. 3-222130

[51] Int. Cl.$^5$ .............................................. G03D 3/02
[52] U.S. Cl. .................................... 354/298; 354/324
[58] Field of Search ............... 354/298, 299, 316, 320, 354/321–324; 134/64 P, 122 P

[56] References Cited

U.S. PATENT DOCUMENTS 5,121,164 6/1992 Landa et al. ...................... 355/246
5,168,296 12/1992 Nakamura et al. ................. 354/320

Primary Examiner—D. Rutledge
Attorney, Agent, or Firm—Jones, Tullar & Cooper

[57] ABSTRACT

An alkaline developing solution is used in development of photosensitive organic resin (photoresist) in liquid crystal board manufacturing process or printed board manufacturing process. The apparatus for controlling developing solution comprises developing solution discharge device for discharging developing solution by detecting the dissolved resin concentration in the developing solution by means of an absorption photometer (16), first replenishing device for replenishing undiluted developing solution and pure water by detecting the liquid level of the developing solution by means of a liquid level gauge (3), and second replenishing device for replenishing undiluted developing solution or pure water by detecting the alkali concentration of the developing solution by an electric conductivity meter (15). By thus constituting, the developing performance of the developing solution may be always kept constant, and the operation down time may be notably shortened.

4 Claims, 10 Drawing Sheets

START ⇨ EXCHANGING SOLUTION
99 %          90 %

APPARATUS FOR CONTROLLING DEVELOPING SOLUTION

BACKGROUND OF THE INVENTION

The invention relates to an apparatus for controlling alkaline developing solution used in developing photosensitive organic resin (photoresist, hereinafter called simply resin) in liquid crystal board manufacturing process, printed board manufacturing process or the like, and more particularly to an apparatus combining a continuous automatic replenishing mechanism in cyclic use of alkaline developing solution, an alkali concentration regulating mechanism, and a developing solution automatic discharge mechanism for arresting deterioration of developing performance due to enrichment of dissolved resin.

In liquid crystal board manufacturing process or printed board manufacturing process, an alkaline aqueous solution, such as tetramethyl ammonium hydroxide (TMAH) aqueous solution (for example, 2.380 wt. %) and potassium hydroxide aqueous solution, is used as a developing solution of resin in spray method or dip method.

In the conventional method, starting by filling a development processing tank with the specified volume of a fresh developing solution at the specified concentration, when the developing solution is consumed and reaches a specified deterioration concentration region, on the basis of an empirical index such as the number of boards processed, the whole volume is exchanged with a prepared fresh solution in the batch operation system. This solution exchanging frequency varies with the type of the boards, but it is generally done once in every about six hours.

An alkaline aqueous solution used as the developing solution of resin gradually lowers in the alkali concentration in the course of use due to reaction with acid in the resin, and absorption and reaction of carbon dioxide and oxygen gas in the air, and the effective sensitivity declines sequentially, but, hitherto, the alkali concentration was not measured in real time and controlled at the specified concentration.

Besides, the resin dissolved in the developing solution in the development processing is gradually enriched, and in the positive resist, it functions to slightly dissolve the resin in the unexposed area that should not be dissolved, and the residual film rate of the unexposed part is gradually lowered, but conventionally the resin concentration was not measured in real time and controlled at the specified concentration.

Therefore, in this period, the alkali concentration and the dissolved resin concentration vary with the passing of the time and are not constant, and it was hence difficult to control the delicate dimensional precision in developing the boards, the product quality was unstable, and the yield was lowered.

Besides, due to stopping of operation (down time) for exchanging solution, the operation rate was significantly lowered, and the exchange work of the developing solution required an extra labor cost.

Moreover, since the developing solution was adjusted to the specified concentration and the specified quality, and shipped in an enclosed container free from contamination with foreign matter, the transportation cost was enormous, and as compared with the undiluted developing solution, the material cost was much higher.

OBJECTS AND SUMMARY OF THE INVENTION

It is hence a primary object of the invention to solve the above-discussed problems of the prior art, while maintaining the advantages of the convenient line conveying system of the prior art suited to mass production in the liquid crystal board manufacturing process, printed board manufacturing process, and the like.

In other words, it is an object of the invention to control automatically the developing solution to the specified alkali concentration and the dissolved resin concentration upon receiving the undiluted developing solution at the using side of the developing solution, control adequately the solution replenishment in the development processing tank so as to keep always constant the developing solution, shorten the operation stopping time markedly, and reduce the comprehensive manufacturing cost.

The invention is intended to adjust and control the resin concentration by measuring the absorbance by experimentally confirming that the concentration of the resin dissolved in the developing solution in the development processing tank is closely related with its absorbance, and to adjust and control the alkali concentration by measuring the electric conductivity by experimentally confirming that the alkali concentration in the developing solution is closely related with its electric conductivity.

To achieve the above objects, the invention presents an apparatus for controlling developing solution which comprises developing solution discharge means for discharging the developing solution by detecting the dissolved resin concentration in the developing solution for photosensitive organic resin by means of an absorption photometer, first replenishing means for replenishing undiluted developing solution and pure water by detecting the liquid level of the developing solution by a liquid level gauge, and second replenishing means for replenishing undiluted developing solution or pure water by detecting the alkali concentration of the developing solution by means of an electric conductivity meter.

In the apparatus for controlling developing solution of the invention, the first replenishing means replenishes, instead of replenishing undiluted developing solution and pure water, a diluted developing solution preliminarily blending the undiluted developing solution and pure water.

The apparatus for controlling developing solution of the invention further comprises third replenishing means for replenishing undiluted developing solution and pure water by detecting the dissolved resin concentration in the developing solution for photosensitive organic resin by means of an absorption photometer, and second replenishing means for replenishing undiluted developing solution or pure water by detecting the alkali concentration of the developing solution by means of an electric conductivity meter.

In the apparatus for controlling developing solution of the invention, the third replenishing means for replenishing by detecting the dissolved resin concentration in the developing solution for the resin by means of an absorption photometer replenishes, instead of replenishing undiluted developing solution and pure water, a diluted developing solution preliminarily blending the undiluted developing solution and pure water.

Examples to be used as the undiluted developing solution include, among others, an inorganic alkaline aqueous solution composed of a single inorganic alkali such as potassium hydroxide, sodium hydroxide, sodium phosphate and sodium silicate or their mixture, and an organic alkaline aqueous solution such as tetramethyl ammonium hydroxide (TMAH) and trimethyl monoethanol ammonium hydroxide (choline).

DETAILED DESCRIPTION OF THE PREFERRED EMBODIMENTS

Figure 1:
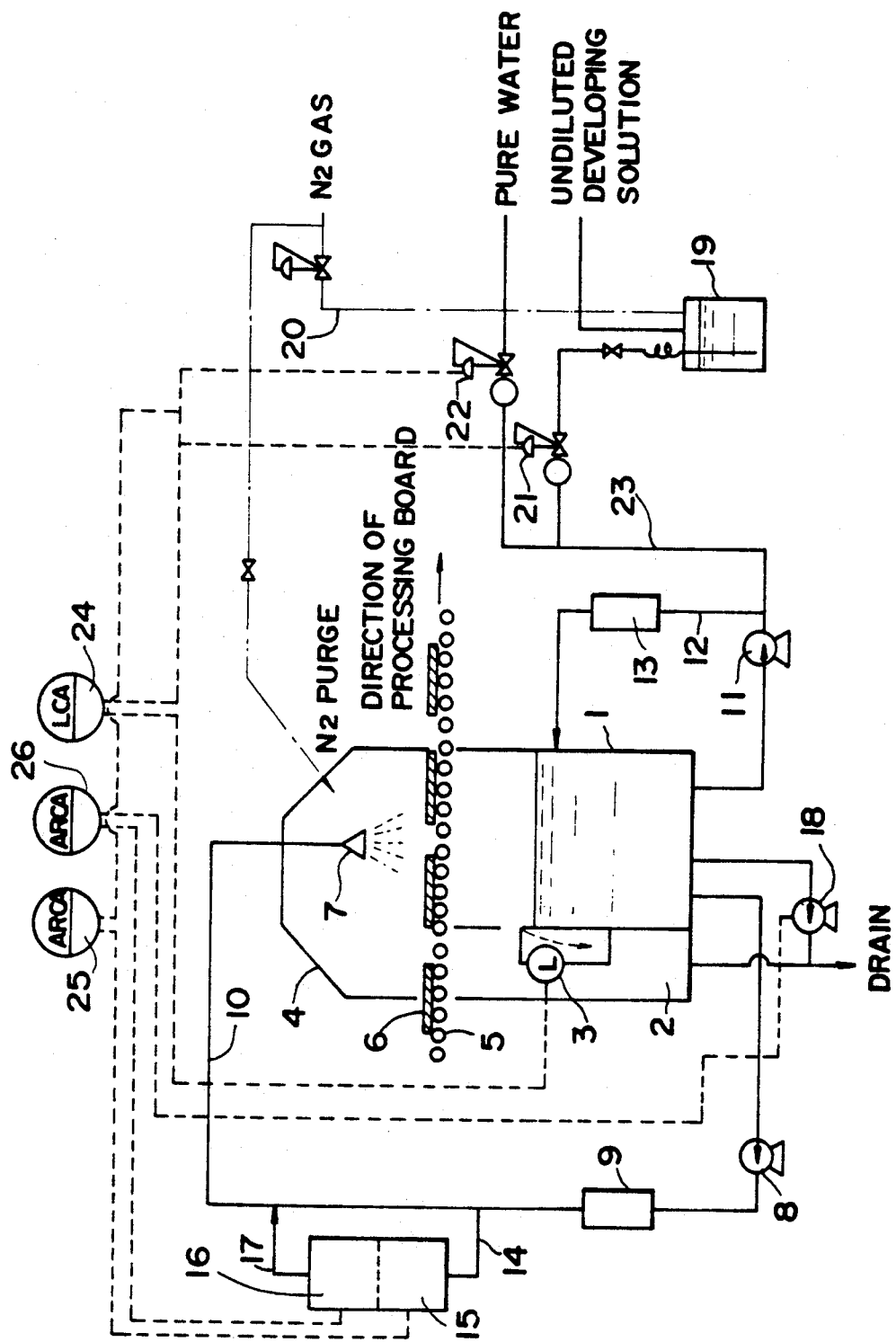
FIG. 1 is a schematic diagram of an apparatus for controlling developing solution showing an embodiment of the invention.

Referring now to the drawings, some of the preferred embodiments of the invention are described in detail below.

As shown in FIG. 1, the invention presents an apparatus for controlling developing solution which comprises developing solution discharge means for discharging the developing solution by detecting the dissolved resin concentration in the developing solution for photosensitive organic resin by means of an absorption photometer 16, first replenishing means for replenishing undiluted developing solution and pure water by detecting the liquid level of the developing solution by a liquid level gauge 3, and second replenishing means for replenishing undiluted developing solution or pure water by detecting the alkali concentration of the developing solution by means of an electric conductivity meter 15.

Figure 2:
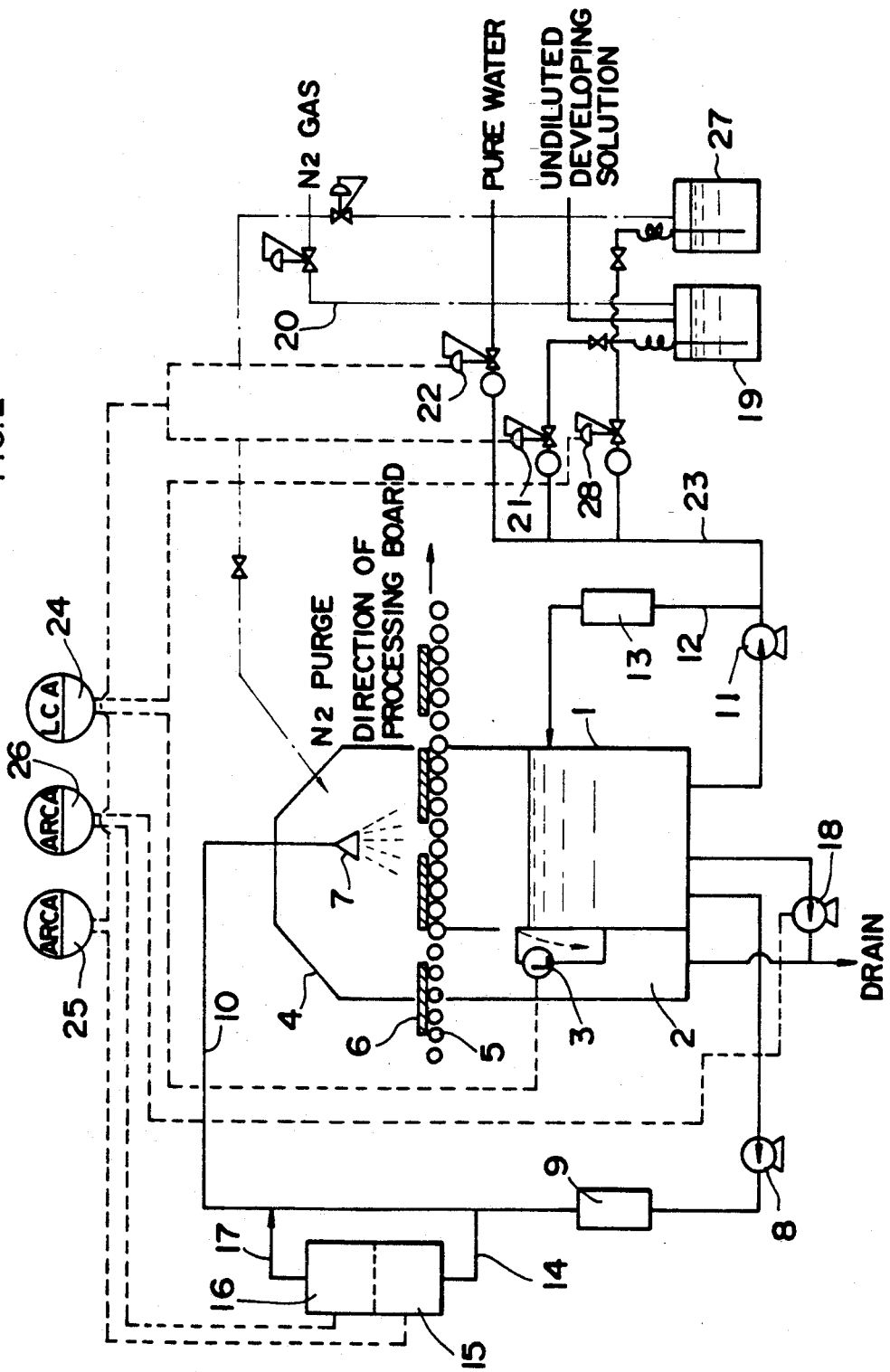
FIG. 2 is a schematic diagram of an apparatus for controlling developing solution showing other embodiment of the invention.

In the apparatus for controlling developing solution of the invention, the first replenishing means replenishes, as shown in FIG. 2, instead of replenishing undiluted developing solution and pure water, a diluted developing solution preliminarily blending the undiluted developing solution and pure water.

Figure 3:
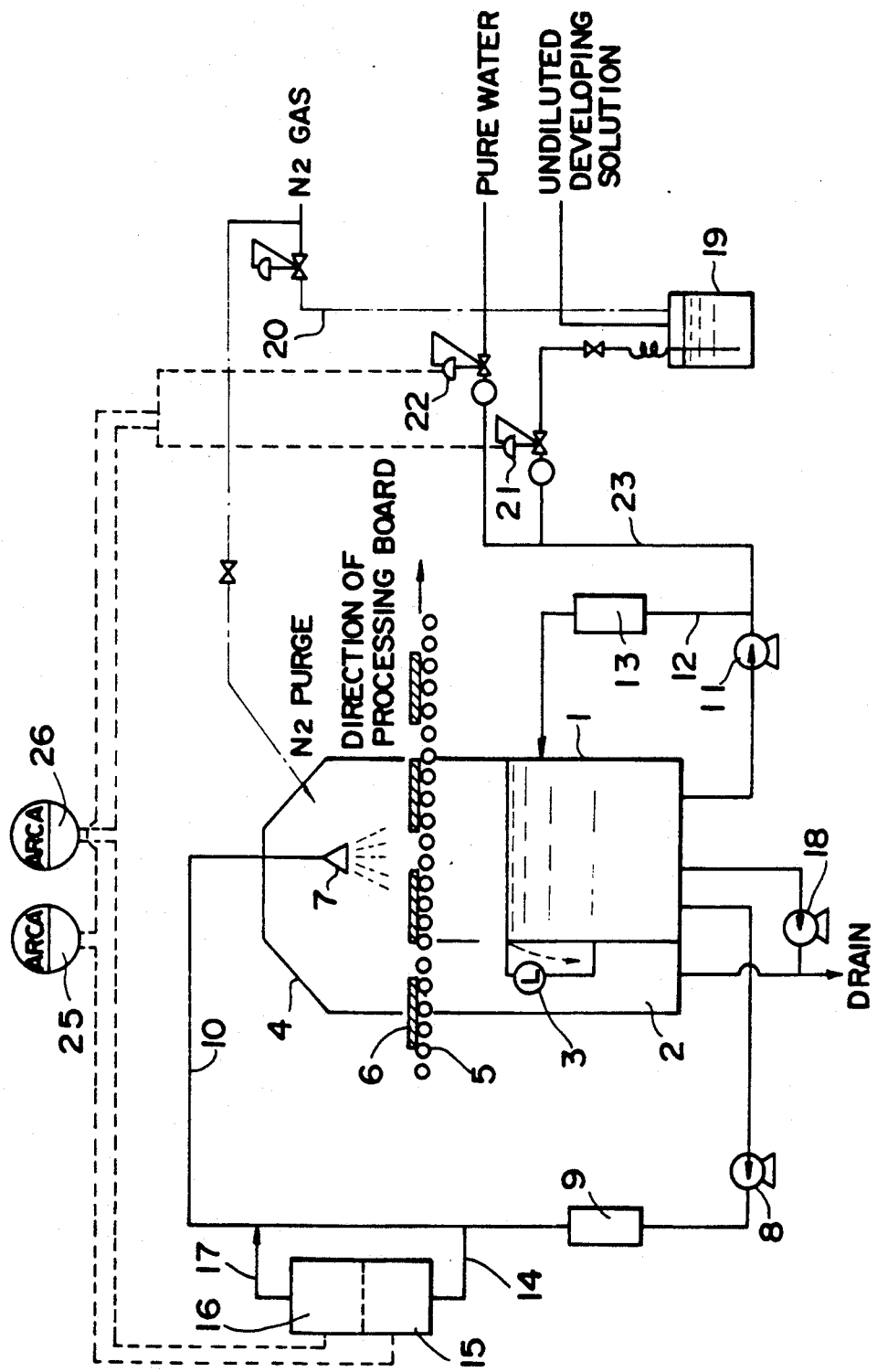
FIG. 3 is a schematic diagram of an apparatus for controlling developing solution showing a different embodiment of the invention.

The apparatus for controlling developing solution of the invention further comprises, as shown in FIG. 3, third replenishing means for replenishing undiluted developing solution and pure water by detecting the dissolved resin concentration in the developing solution for photosensitive organic resin by means of an absorption photometer 16, and second replenishing means for replenishing undiluted developing solution or pure water by detecting the alkali concentration of the developing solution by means of an electric conductivity meter 15.

Figure 4:
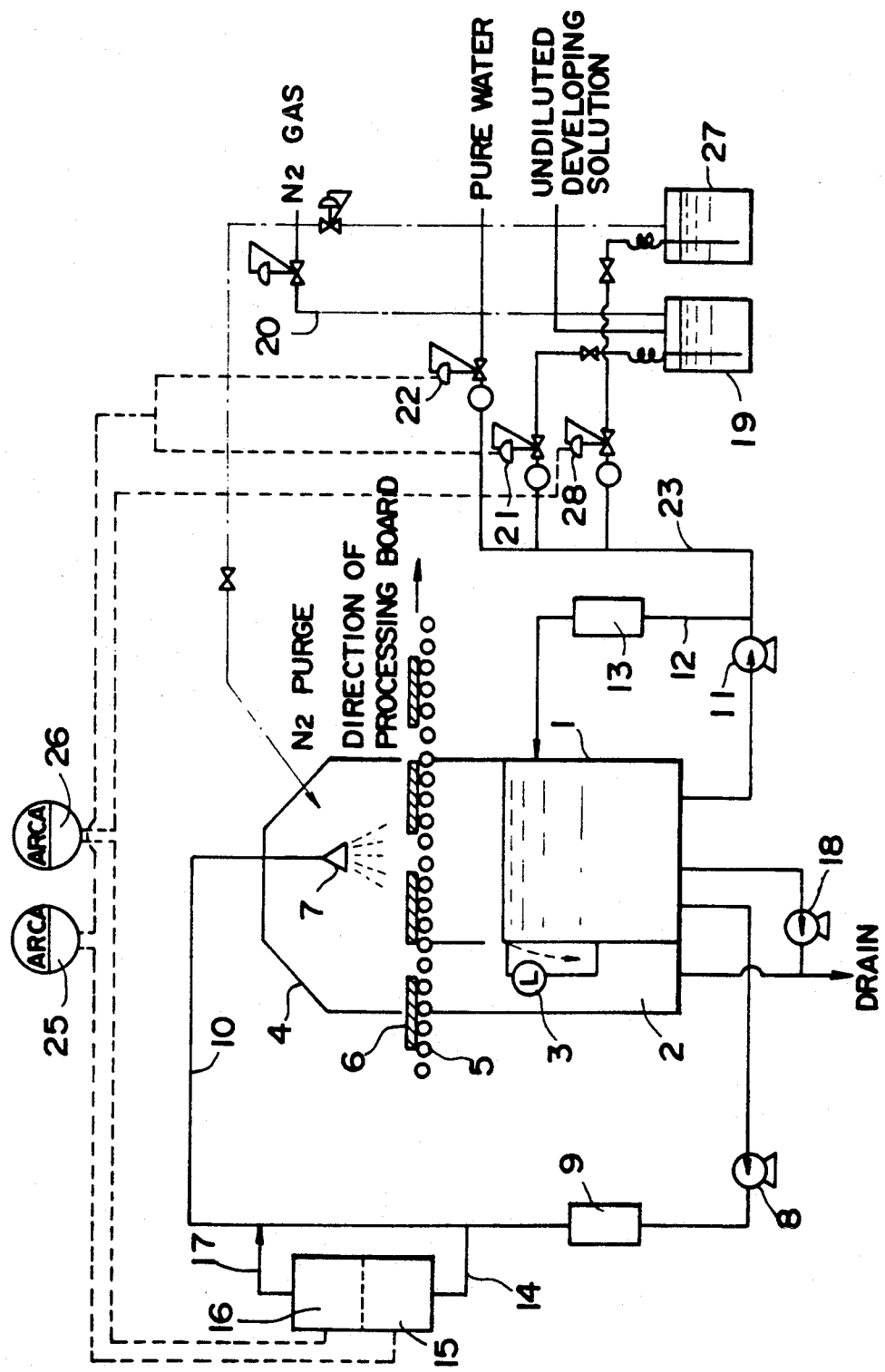
FIG. 4 is a schematic diagram of an apparatus for controlling developing solution showing a further different embodiment of the invention.

In the apparatus for controlling developing solution of the invention, as shown in FIG. 4, the third replenishing means for replenishing by detecting the dissolved resin concentration in the developing solution for the resin by means of an absorption photometer 16 replenishes, instead of replenishing undiluted developing solution and pure water, a diluted developing solution preliminarily blending the undiluted developing solution and pure water.

FIG. 1 is a schematic diagram of an apparatus showing an embodiment of the invention. In the diagram, reference numbers 1 to 13 correspond to the units for composing the conventional development processing apparatus. That is, the conventional development processing apparatus comprises a development processing tank 1 for storing the developing solution, an overflow tank 2, a liquid level gauge 3, a development compartment hood 4, a developing solution spray 7, a liquid feed pump 8 for feeding the solution to the developing solution spray, a filter 9 for removing fine particles from the developing solution, roller conveyors 5 moving while developing with a board mounted on, boards 6, a circulation pump 11 for clarifying and agitating developing solution, a filter 13 for removing fine particles, and pipings for $N_2$, pure water, etc.

According to the invention, the devices attached to the development processng apparatus include an electric conductivity meter 15, absorption photometer 16, liquid discharge pump 18, undiluted developing solution feed tank 19, flow rate regulating valve 21 for feeding undiluted developing solution, flow rate regulating valve 22 for feeding pure water, pipings for connecting these devices, electric instrumentations or pneumatic instrumentations.

The liquid volume stored in the development processing tank 1 is sufficient if enough to feed the required volume for the developing solution spray 7, but it must be controlled for the stability of the process. The liquid level gauge 3 detects liquid level drop due to spontaneous decrease as the solution adhesion on the board and is brought outside during development process, or detects liquid level drop when the solution deteriorating in development performance is discharged by force, and controls the liquid volume in the development processing tank 1 in a specific range. Here, the old solution is passed into the drain piping by operating the discharge pump 18. Or the old solution may be directly discharged out of the system without passing through the drain piping.

The feed tank 19 of undiluted developing solution (e.g. 15 to 20 wt. % aqueous solution of TMAH, concentrated aqueous solution of KOH) is pressurized to, for example, 1 to 2 kgf/cm² by $N_2$ gas from the piping 20, and the solution is fed under pressure as the undiluted developing solution flow rate regulating valve 21 opens. The pure water is supplied from a branch piping from the existing piping, and is fed as the pure water flow regulating valve 22 opens. The undiluted developing solution and pure water are fed as the individual valves are regulated automatically, and are joined at the duct 23 and led to the duct 12, thereby are entered into the development processing tank 1 as being mixed with the circulating flow. It is also possible to supply the undiluted developing solution and pure water directly into the duct 12 or development processing tank 1 without joining on the way. It is, however, desired to join the undiluted developing solution and pure water at the duct 23 and then lead to the circulating duct 12 because they are mixed sufficiently.

A sample solution is fed from the duct 14 into the electric conductivity meter 15 and the absorption photometer 16 (for example, the two instruments are combined in one body) installed online in the duct 10 for the developing solution spray, and the electric conductivity and the absorbance are measured continuously, and the measured solution is returned to the duct 10 through the duct 17. It is also possible to install the electric conductivity meter 15 and the absorption photometer 16 separately.

FIG. 2 is a schematic diagram of an apparatus showing other embodiment of the invention. In the embodiment, instead of replenishing undiluted developing solution and pure water by detecting the liquid level of the developing solution by the liquid level gauge 3, as shown in FIG. 2, the liquid level of the developing solution is detected by the liquid level gauge 3, and a fresh developing solution preliminarily blending the undiluted developing solution and pure water is replenished. Numeral 27 is a feed tank for fresh developing solution, and 28 is a fresh solution flow rate regulating valve. The other constitution is same as in FIG. 1.

FIG. 3 is a schematic diagram of an apparatus showing a different embodiment of the invention. The embodiment is composed so as to detect the dissolved resin concentration in the developing solution for resin by the absorption photometer 16, and replenish undiluted developing solution and pure water. As shown in FIG. 3, usually, the liquid level is near the weir for overflow, and when undiluted developing solution or pure water is replenished, the old developing solution overflows from the overflow weir, and is discharged automatically. The discharge pump 18 is not necessarily required, and a valve may be disposed in place of the discharge pump 18. The other constitution is same as in FIG. 1.

FIG. 4 is a schematic diagram of an apparatus showing a further different embodiment of the invention. The embodiment is desinged to replenish a fresh developing solution preliminarily blending the undiluted developing solution and pure water as shown in FIG. 4, instead of replenishing undiluted developing solution and pure water in the third replenishing means for replenishing by detecting the dissolved resin concentration in the developing solution for resin by the absorption photometer 16. The other constitution is same as in FIG. 3.

The control system of the apparatus in the embodiment in FIG. 1 is explained. The liquid level gauge 3 and the liquid level in the development processing tank 1, the electric conductivity meter 15 and the alkali concentration of developing solution, and the absorption photometer 16 and the dissolved resin concentration in developing solution are mutually independent functions in nature, but it is characteristic of the invention to function them in mutually complementary relation.

Besides, in the first place, the target value of alkali concentration of the developing solution and the deterioration limit value of the dissolved resin concentration necessary for quality control of product boards must be preset in the controllers on the basis of experience or calculation.

Figure 5:
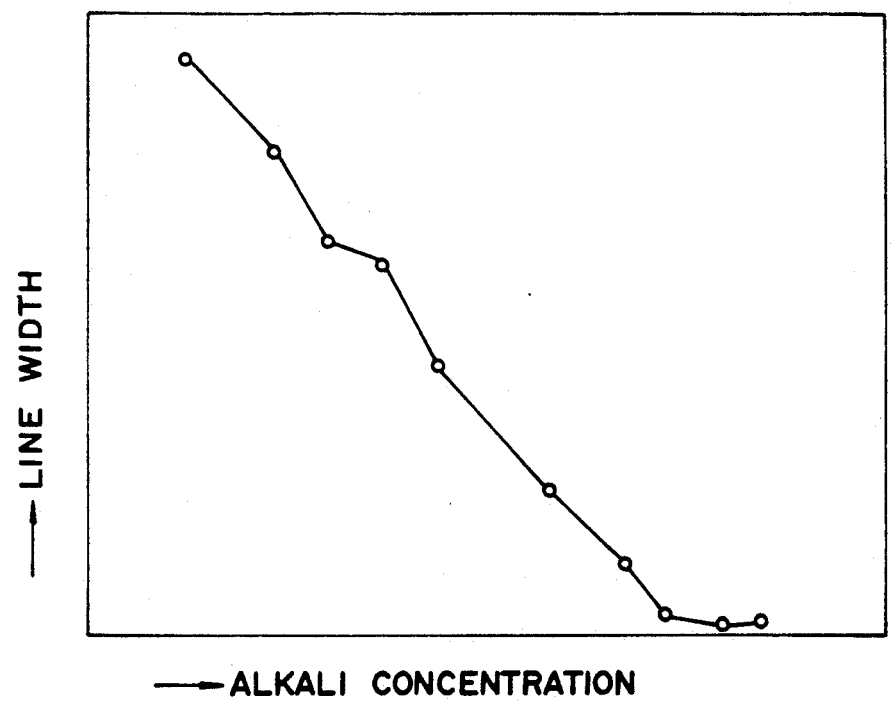
FIG. 5 is a graph of an operation example showing the relation between the alkali concentration and the line width of resin after development.

The alkali concentration of the developing solution declines due to reaction with board resin, or absorption or reaction of carbon dioxide and oxygen gas in air. As the alkali concentration declines, the line width after development of the board resin changes to be thick (or narrow in space), differing largely from the initial design value, which results in phenomenon of poor dimensional precision. A practical example of operation is shown in FIG. 5.

Therefore, the alkali concentration of the developing solution must be controlled at a specified target value, for example, 2.38 ($\pm 0.02$) wt. % in the case of TMAH. Conventionally, empirically, the degree of deterioration of the developing solution was judged by the correlation with the number of boards processed or chemical analysis or the like, but prompt and accurate grasp was difficult.

Figure 6:
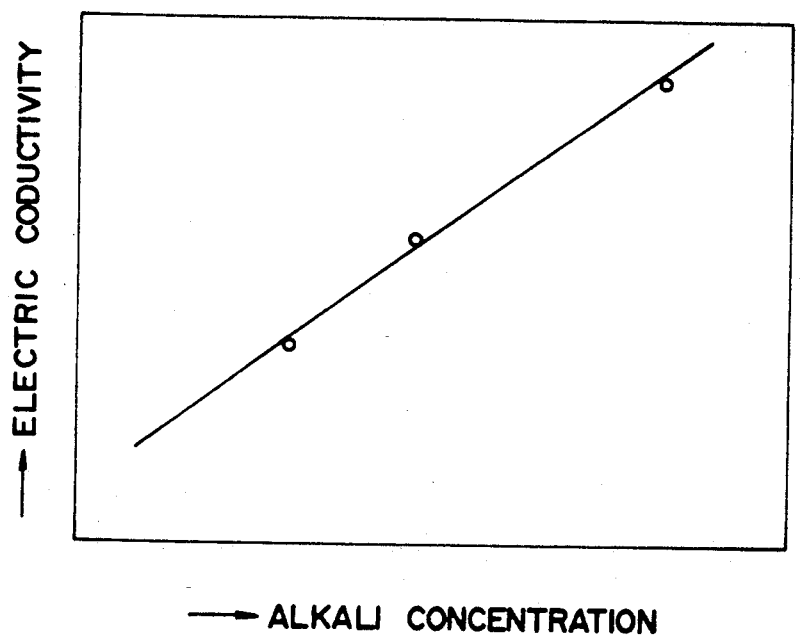
FIG. 6 is a graph of an embodiment showing the relation between the electric conductivity and the alkali concentration relating to the invention.

The present inventor experimentally studied the relation between the alkali concentration of developing solution and the electric conductivity, and learned that the alkali concentration was predominant over the electric conductivity near the concentration of use as shown in FIG. 6 so that it could be measured with an advanced linear function.

The electric conductivity meter 15 installed online in the duct 10 has compensating functions to minimize the measuring error and a conductivity controller 25. The conductivity measurement of the sample solution led in from the duct 10 is fed into the conductivity controller 25, and the undiluted developing solution or pure water is automatically controlled by the flow rate regulating valves 21, 22 by the output signal so as to coincide with the target value, and replenished until the alkali concentration is adjusted to the target value.

Figure 7:
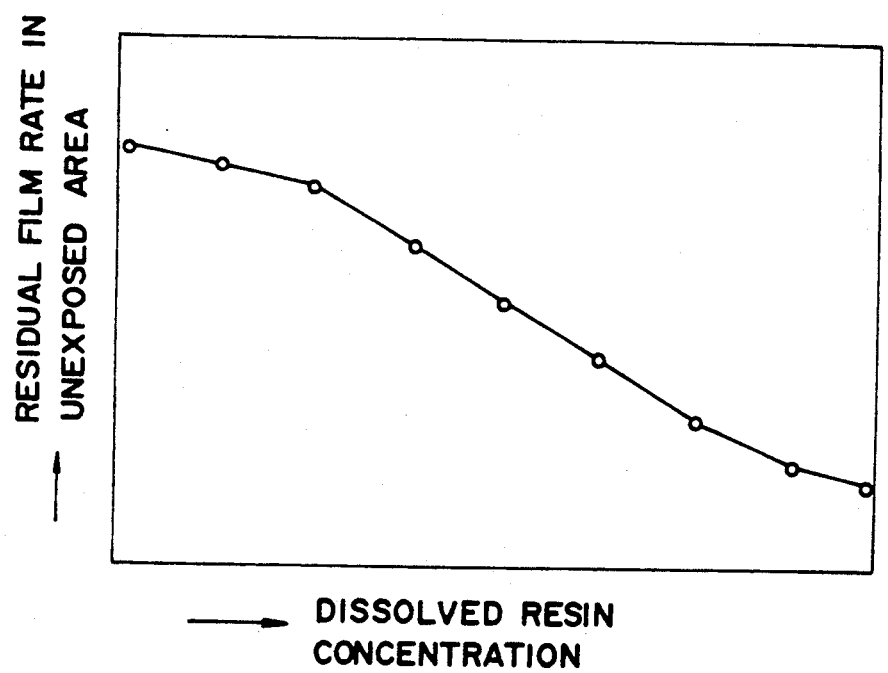
FIG. 7 is a graph of an operation example showing the relation between the dissolved resin concentration and the residual film rate in unexposed area.

Deterioration of developing performance is also related with the dissolved resin concentration, aside from the alkali concentration. The developing solution processing the board is taken out from the development processing tank 1 by the liquid feed pump 8, and is circulated through the developing solution spray 7, and therefore the dissolved resin is gradually concentrated in the developing solution. As a result, as shown in operation example in FIG. 7, the residual film rate in the unexposed area drops and the developing performance detriorates significantly, but hitherto the concentration change was not measured in real time to control the developing performance at a specific value. That is, the index of deterioration was the number of boards processed, but since the board shape, resin coating volume and the ratio between the exposed part and the unexposed part are not constant, and the dissolved resin amount varies in each type of board, and hence it is difficult to judge by the number of boards processed.

Figure 8:
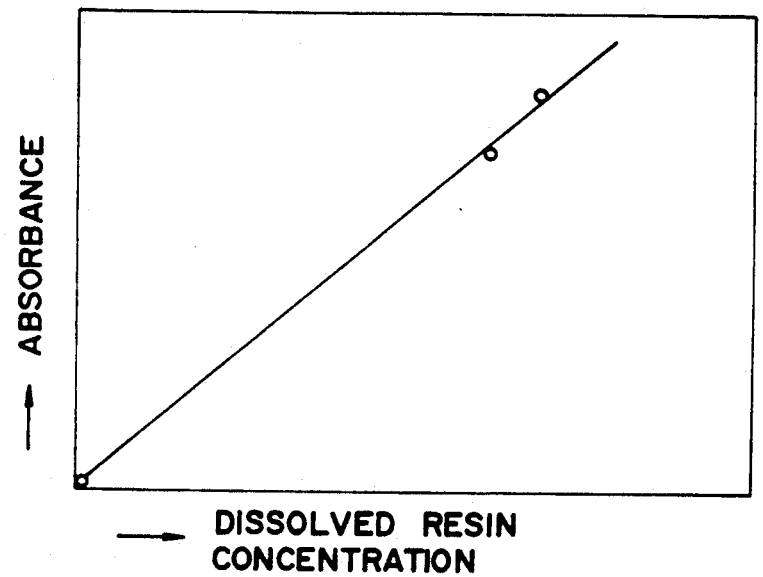
FIG. 8 is a graph of an embodiment showing the relation between the absorbance and the dissolved resin concentration relating to the invention.

The present inventor attempted to measure it in relation with the absorbance from the studies on the resin contamination state of the developing solution, and obtained the result as shown in FIG. 8 by experiment. As shown in FIG. 8, the dissolved resin concentration and the absorbance are in an advanced linear relation regardless of the alkali concentration, and it is possible to judge the limit of the developing performance by the dissolved resin concentration itself regardless of the number of boards processed. Meanwhile, since the developing solution becomes red due to dissolved resin, the measuring wavelength was 480 nm.

Therefore, the absorption photometer 16 installed in the duct 10 in one body with or separately from the electric conductivity meter 15 continuously measures the dissolved resin concentration in the developing solution, and when the value exceeding the deterioration limit is detected, the discharge pump 18 is put in operation by the output signal from the absorbance controller 26, and the deteriorating developing solution is drawn out from the development processing tank 1, and is discharged into the drain pipe, or directly discarded out of the system. As a result, in the development processing tank 1 lowered in level, the liquid level gauge 3 immediately detects the lowered liquid level, and a fresh developing solution is replenished, and the dissolved resin concentration is diluted to the deterioration limit value, so that the developing performance is recovered, and the discharge pump 18 stops.

Here is stated the functional relation of the control system intended by the apparatus in the embodiment in FIG. 1. When the development processing tank 1 is empty and building up a solution, the liquid level gauge 3 detects the liquid level, and by the output signal from the liquid level controller 24, the undiluted developing solution and pure water are supplied, at a proper flow rate ratio, by regulating the valve opening degree by means of flow rate regulating valves 21, 22.

In succession, the electric conductivity meter 15 continuously measures the electric conductivity of the built-up developing solution, and by the output signal from the conductivity controller 25, the undiluted developing solution or pure water is supplied, at a proper small flow rate, by regulating the valve opening degree by the flow rate regulating valve 21 or 22 so as to be controlled automatically to achieve the alkali concentration of the target value.

When the next development processing is started, lowering of alkali concentration, drop of liquid level due to carry-over by boards, and enrichment of dissolved resin are progressed.

When the alkali concentration is lowered, the electric conductivity of the developing solution is continuously measured by the electric conductivity meter 15, and by the output signal of the conductivity controller 25, the undiluted developing solution is supplied at a proper small flow rate by regulating the valve opening degree by the flow rate regulating valve 21 so as to be controlled automatically to maintain the alkali concentration of the target value.

When the level of the solution drops as being brought out by the boards, the liquid level gauge 3 detects the lowered liquid level, and by the output signal of the liquid level controller 24, the undiluted developing solution and pure water are supplied at a proper flow rate ratio by regulating the valve opening degree by means of the flow rate regulating valves 21, 22.

When the dissolved resin is concentrated to reach the deterioration limit, the absorption photometer 16 detects the value exceeding the deterioration limit by continuously measuring the dissolved resin concentration of the developing solution, and by the output signal of the absorbance controller 26, the discharge pump 18 is put in action, and the deteriorating developing solution is drawn out from the development processing tank 1, and discarded into the drain pipe, or discarded directly out of the system.

As a result, the liquid level drops, and the liquid level gauge 3 detects the lowered liquid level, and by the output signal of the liquid level controller 24, the undiluted developing solution and pure water are supplied at a proper flow rate ratio by regulating the valve opening degree by the flow rate regulating valves 21, 22. Since a fresh developing solution is replenished, the developing performance is recovered as the dissolved resin concentration is diluted to the deterioration limit, and the discharge pump 18 stops.

Above the liquid level gauge 3, an overflow weir is disposed at a position not allowing to overflow usually, but a slight overflow does not matter.

Next is described the functional relation of the control system intended by the apparatus of the embodiment shown in FIG. 3. When the development processing tank 1 is empty and building up a solution, by manual operation, the undiluted developing solution and pure water are supplied at a proper flow rate ratio by regulating the valve opening degree by the flow rate regulating valves 21, 22.

The electric conductivity meter 15 continuously measures the electric conductivity of the built-up developing solution, and by the output signal of the conductivity controller 25, the undiluted developing solution or pure water is supplied at a proper small flow rate by regulating the valve opening degree by the flow rate regulating valve 21 or 22 so as to be controlled automatically to reach the target of alkali concentration.

When next development process begins, lowering of alkali concentration, drop of liquid level as brought out by boards, and enrichment of dissolved resin are advanced.

In the case of lowering of alkali concentration, the electric conductivity meter 15 continuously measures the electric conductivity of the developing solution, and by the output signal of the conductivity controller 25, the undiluted developing solution is supplied at a proper small flow rate by regulating the valve opening degree by the flow rate regulating valve 21 so as to be controlled automatically to reach the target of alkali concentration.

When the liquid level drops as being brought out by the boards, the liquid level is slightly lower than the weir position for overflow.

When the dissolved resin is enriched to reach the deterioration limit, the absorption photometer 16 continuously measures the dissolved resin concentration in the developing solution, and when any value exceeding the deterioration limit is detected, by the output of the absorbance controller 26, the undiluted developing solution and pure water are supplied at a proper flow rate ratio by regulating the valve opening degree by the flow rate regulating valves 21, 22. Since a fresh developing solution is replenished, the dissolved resin concentration is diluted to the deterioration limit value, so that the developing performance is recovered.

The liquid level is near the weir position for overflow, and when the undiluted developing solution or pure water is replenished, the deteriorating developing solution overflows from the overflow weir.

The present inventor, by applying the results on the basis of the control functions in mutually complementary relations as described above, found by experiment that the recovery of developing performance, continuous operation, and saving of consumption of developing solution may be realized easily and comprehensively.

Figure 9:
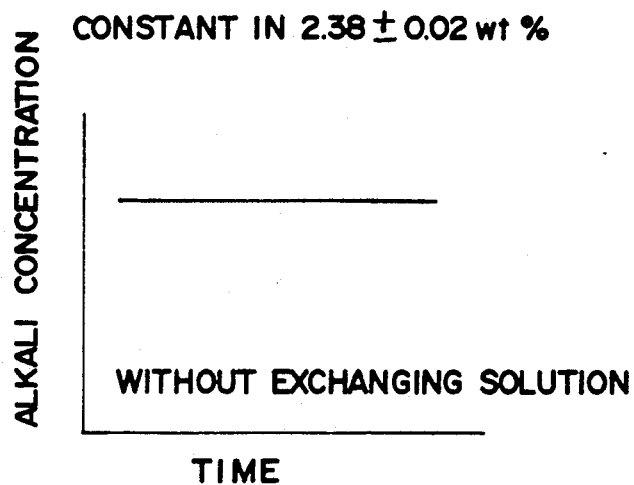
FIG. 9 is a graph showing the relation between the alkali concentration and the time when the apparatus of the invention is used.
Figure 10:
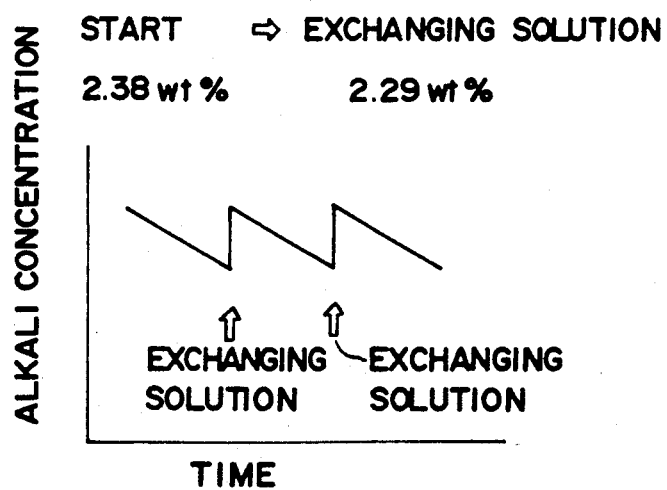
FIG. 10 is a graph showing the relation between the alkali concentration and the time in the conventional method.

Moreover, for conceptual understanding, the operation pattern effects are compared between the invention and the prior art in FIGS. 9 to 12. In the prior art, as shown in FIG. 10, the starting alkali concentration was, for example, 2.38 wt. %, and the solution was exchanged when the concentration was lowered to, for example, 2.29 wt. % in the course of time. In this case, as shown in FIG. 10, the alkali concentration transition is in a sawtooth profile, and due to variation width of the alkali concentration, the developing performance was not constant.

By the apparatus of the invention, on the other hand, as shown in FIG. 9, the alkali concentration remains constant at, for example, 2.38±0.02 wt. % in the course of time, and it is not necessary to exchange the solution, and the development performance is constant.

Figure 12:
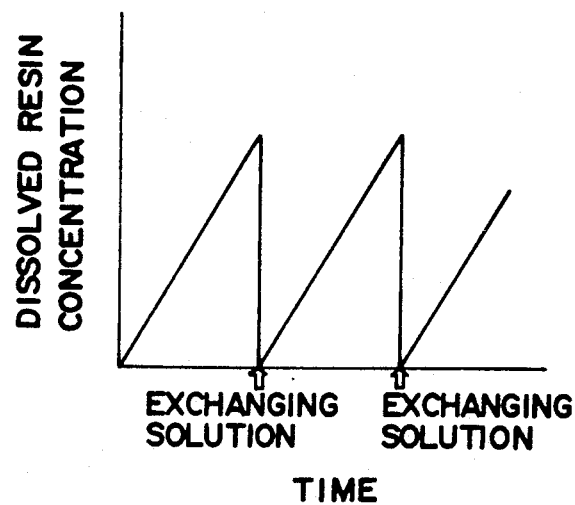
FIG. 12 is a graph showing the relation between the dissolved resin concentration and the time in the conventional method.

In the prior art, moreover, as shown in FIG. 12, the starting dissolved resin concentration (at this time, the residual film rate in unexposed area is, for example, 99%) increased as the time passed, and the solution was exchanged when the concentration reached a specific value (at this time, the residual film rate in unexposed area is, for example, 90%). In this case, as shown in FIG. 12, the time course change of the dissolved resin concentration is in a sawtooth profile, and variation width occurred in the dissolved resin concentration, and hence the developing performance was not stable.

Figure 11:
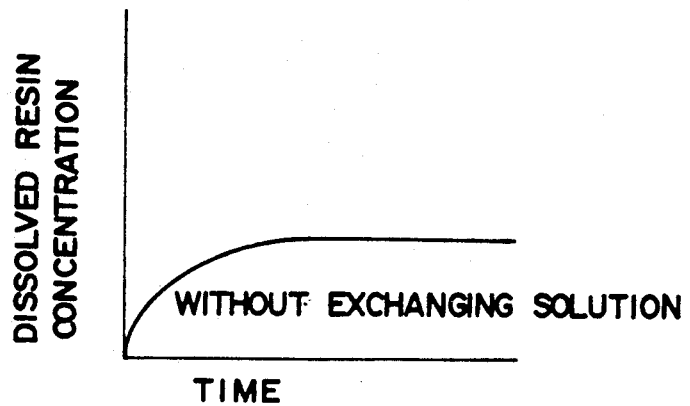
FIG. 11 is a graph showing the relation between the dissolved resin concentration and the time when the apparatus of the invention is used.

According to the apparatus of the invention, by contrast, the dissolved resin concentration remains constant after a certain time lapse as shown in FIG. 11, and hence the residual film rate in unexposed area is constant, not lowering, and it is not necessary to exchange the solution, and the developing performance is constant.

Thus, having such constitution, the invention brings about the following effects.

(1) By applying the invention in the liquid crystal board manufacturing process or the printed board manufacturing process, the alkali concentration and the dissolved resin concentration in the developing solution are always monitored and controlled with the desired target range, and continuous operation is possible for a long period at a stable liquid level.

(2) Since the quality of the developing solution may be controlled constant, the developing performance of board is stable, and when applied in the liquid crystal board manufacturing process, comprehensive effects are achieved, including a significant saving of consumption of solution, decrese of down time, and reduction of labor and developing solution cost.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An apparatus for controlling developing solution comprising developing solution discharge means for discharging developing solution by detecting the dissolved resin concentration in the developing solution for photosensitive organic resin by means of an absorption photometer, first replenishing means for replenishing undiluted developing solution and pure water by detecting the liquid level of the developing solution by means of a liquid level gauge, and second replenishing means for replenishing undiluted developing solution or pure water by detecting the alkali concentration of the developing solution by means of an electric conductivity meter.

2. An apparatus for controlling developing solution comprising developing solution discharge means for discharging developing solution by detecting the dissolved resin concentration in the developing solution for photosensitive organic resin by means of an absorption photometer, first replenishing means for replenishing a fresh developing solution preliminarily blending undiluted developing solution and pure water by detecting the liquid level of the developing solution by means of a liquid level gauge, and second replenishing means for replenishing undiluted developing solution or pure water by detecting the alkali concentration of the developing solution by means of an electric conductivity meter.

3. An apparatus for controlling developing solution comprising third replenishing means for replenishing undiluted developing solution and pure water by detecting the dissolved resin concentration in the developing solution for photosensitive organic resin by means of an absorption photometer, and second replenishing means for replenishing undiluted developing solution or pure water by detecting the alkali concentration of the developing solution by means of an electric conductivity meter.

4. An apparatus for controlling developing solution comprising third replenishing means for replenishing a fresh developing solution preliminarily blending undiluted developing solution and pure water by detecting the dissolved resin concentration in the developing solution for photosensitive organic resin by means of an absorption photometer, and second replenishing means for replenishing undiluted developing solution or pure water by detecting the alkali concentration of the developing solution by means of an electric conductivity meter.

* * * * *